United States Patent
Kuukasjärvi et al.

(10) Patent No.: US 12,332,323 B2
(45) Date of Patent: Jun. 17, 2025

(54) DETERMINING DIAGNOSTICS INFORMATION BASED ON NON-REAL-TIME DATA

(71) Applicant: ABB Schweiz AG, Baden (CH)

(72) Inventors: Mika Kuukasjärvi, Jyväskylä (FI); Lasse Lipsanen, Helsinki (FI); Olli-Petteri Karjalainen, Kuopio (FI)

(73) Assignee: ABB Schweiz AG, Baden (CH)

( * ) Notice: Subject to any disclaimer, the term of this patent is extended or adjusted under 35 U.S.C. 154(b) by 454 days.

(21) Appl. No.: 17/650,903

(22) Filed: Feb. 14, 2022

(65) Prior Publication Data

US 2022/0268858 A1 Aug. 25, 2022

(30) Foreign Application Priority Data

Feb. 22, 2021 (EP) .................................. 21158378

(51) Int. Cl.
*G01R 31/66* (2020.01)

(52) U.S. Cl.
CPC .................................. *G01R 31/66* (2020.01)

(58) Field of Classification Search
CPC ...................................................... G01R 31/66
See application file for complete search history.

(56) References Cited

U.S. PATENT DOCUMENTS

| | | | | |
|---|---|---|---|---|
| 7,599,365 B1* | 10/2009 | Sabol | ................. | H04L 61/2514 370/389 |
| 9,797,247 B1* | 10/2017 | Nelson | ................. | E21F 13/02 |
| 2005/0158701 A1* | 7/2005 | West | ................. | G05D 21/02 435/286.1 |
| 2008/0320582 A1* | 12/2008 | Chen | ................. | H04L 63/105 726/13 |
| 2009/0113108 A1* | 4/2009 | Becker | ................. | G06F 13/4027 710/314 |
| 2012/0076007 A1* | 3/2012 | Nelson | ................. | H04W 64/00 370/252 |
| 2015/0085665 A1* | 3/2015 | Kompella | ................. | H04L 41/0893 370/236 |
| 2018/0232031 A1* | 8/2018 | Swierk | ................. | H04L 43/08 |
| 2020/0099762 A1* | 3/2020 | Eckhardt | ................. | G05B 19/4186 |

FOREIGN PATENT DOCUMENTS

| | | | | |
|---|---|---|---|---|
| CN | 101741637 | A | 6/2010 | |
| CN | 105703969 | A | 6/2016 | |
| CN | 108494626 | A | 9/2018 | |
| CN | 208092512 | U | 11/2018 | |
| CN | 208723925 | U | 4/2019 | |
| CN | 110545211 | A | 12/2019 | |
| EP | 2592812 | A2 * | 5/2013 | .......... G06F 11/3495 |
| EP | 2592812 | A3 | 5/2013 | |

OTHER PUBLICATIONS

European Search Report; Application No. EP 21 15 8378; Issued: Jul. 9, 2021; 3 Pages.
Chinese Office Action; Application No. 202210153325.8; Completed: Oct. 12, 2023; Issued: Oct. 18, 2023; 21 Pages.

* cited by examiner

*Primary Examiner* — Natalie Huls
*Assistant Examiner* — Nyla Gavia
(74) *Attorney, Agent, or Firm* — Whitmyer IP Group LLC

(57) ABSTRACT

Disclosed is a method comprising obtaining non-real-time data from a plurality of devices comprised in a process field network, and determining diagnostics information for at least a part of the process field network based at least partly on the non-real-time data.

15 Claims, 3 Drawing Sheets

DETERMINING DIAGNOSTICS INFORMATION BASED ON NON-REAL-TIME DATA

RELATED APPLICATIONS

This application claims priority to European patent application no. 21158378, filed on Feb. 22, 2021, the contents of which is hereby incorporated herein by reference in its entirety.

FIELD

Various exemplary embodiments relate to industrial communication networks.

BACKGROUND

In industrial communication networks, there is a challenge in how to monitor a large number of industrial devices, which may include devices from different manufacturers, for example.

SUMMARY

The scope of protection sought for various exemplary embodiments is set out by the independent claims. The exemplary embodiments and features, if any, described in this specification that do not fall under the scope of the independent claims are to be interpreted as examples useful for understanding various exemplary embodiments.

According to an aspect, there is provided an apparatus comprising means for: obtaining non-real-time data from a plurality of devices comprised in a process field network, wherein the non-real-time data comprises at least one of: port-related configuration data, port-related status data, and/or port-related statistics data for the plurality of devices; and determining diagnostics information for at least a part of the process field network based at least partly on the obtained non-real-time data.

According to another aspect, there is provided an apparatus comprising at least one processor, and at least one memory including computer program code, wherein the at least one memory and the computer program code are configured, with the at least one processor, to cause the apparatus to: obtain non-real-time data from a plurality of devices comprised in a process field network, wherein the non-real-time data comprises at least one of: port-related configuration data, port-related status data, and/or port-related statistics data for the plurality of devices; and determine diagnostics information for at least a part of the process field network based at least partly on the obtained non-real-time data.

According to another aspect, there is provided a method comprising obtaining non-real-time data from a plurality of devices comprised in a process field network, wherein the non-real-time data comprises at least one of: port-related configuration data, port-related status data, and/or port-related statistics data for the plurality of devices; and determining diagnostics information for at least a part of the process field network based at least partly on the obtained non-real-time data.

According to another aspect, there is provided a computer-implemented method comprising obtaining, by an apparatus, non-real-time data from a plurality of devices comprised in a process field network, wherein the non-real-time data comprises at least one of: port-related configuration data, port-related status data, and/or port-related statistics data for the plurality of devices; and determining, by the apparatus, diagnostics information for at least a part of the process field network based at least partly on the obtained non-real-time data.

According to another aspect, there is provided a computer program comprising instructions for causing an apparatus to perform at least the following: obtain non-real-time data from a plurality of devices comprised in a process field network, wherein the non-real-time data comprises at least one of: port-related configuration data, port-related status data, and/or port-related statistics data for the plurality of devices; and determine diagnostics information for at least a part of the process field network based at least partly on the obtained non-real-time data.

According to another aspect, there is provided a computer readable medium comprising program instructions for causing an apparatus to perform at least the following: obtain non-real-time data from a plurality of devices comprised in a process field network, wherein the non-real-time data comprises at least one of: port-related configuration data, port-related status data, and/or port-related statistics data for the plurality of devices; and determine diagnostics information for at least a part of the process field network based at least partly on the obtained non-real-time data.

According to another aspect, there is provided a non-transitory computer readable medium comprising program instructions for causing an apparatus to perform at least the following: obtain non-real-time data from a plurality of devices comprised in a process field network, wherein the non-real-time data comprises at least one of: port-related configuration data, port-related status data, and/or port-related statistics data for the plurality of devices; and determine diagnostics information for at least a part of the process field network based at least partly on the obtained non-real-time data.

According to another aspect, there is provided a system comprising at least an apparatus and a plurality of devices, wherein the apparatus is configured to: obtain non-real-time data from the plurality of devices, wherein the non-real-time data comprises at least one of: port-related configuration data, port-related status data, and/or port-related statistics data for the plurality of devices; and determine diagnostics information for at least a part of the process field network based at least partly on the obtained non-real-time data.

According to another aspect, there is provided a system comprising at least an apparatus and a process field network comprising a plurality of devices, wherein the apparatus comprises means for: obtaining non-real-time data from the plurality of devices, wherein the non-real-time data comprises at least one of: port-related configuration data, port-related status data, and/or port-related statistics data for the plurality of devices; and determining diagnostics information for at least a part of the process field network based at least partly on the obtained non-real-time data.

BRIEF DESCRIPTION OF THE DRAWINGS

In the following, various exemplary embodiments will be described in greater detail with reference to the accompanying drawings, in which.

DETAILED DESCRIPTION

Figure 1:
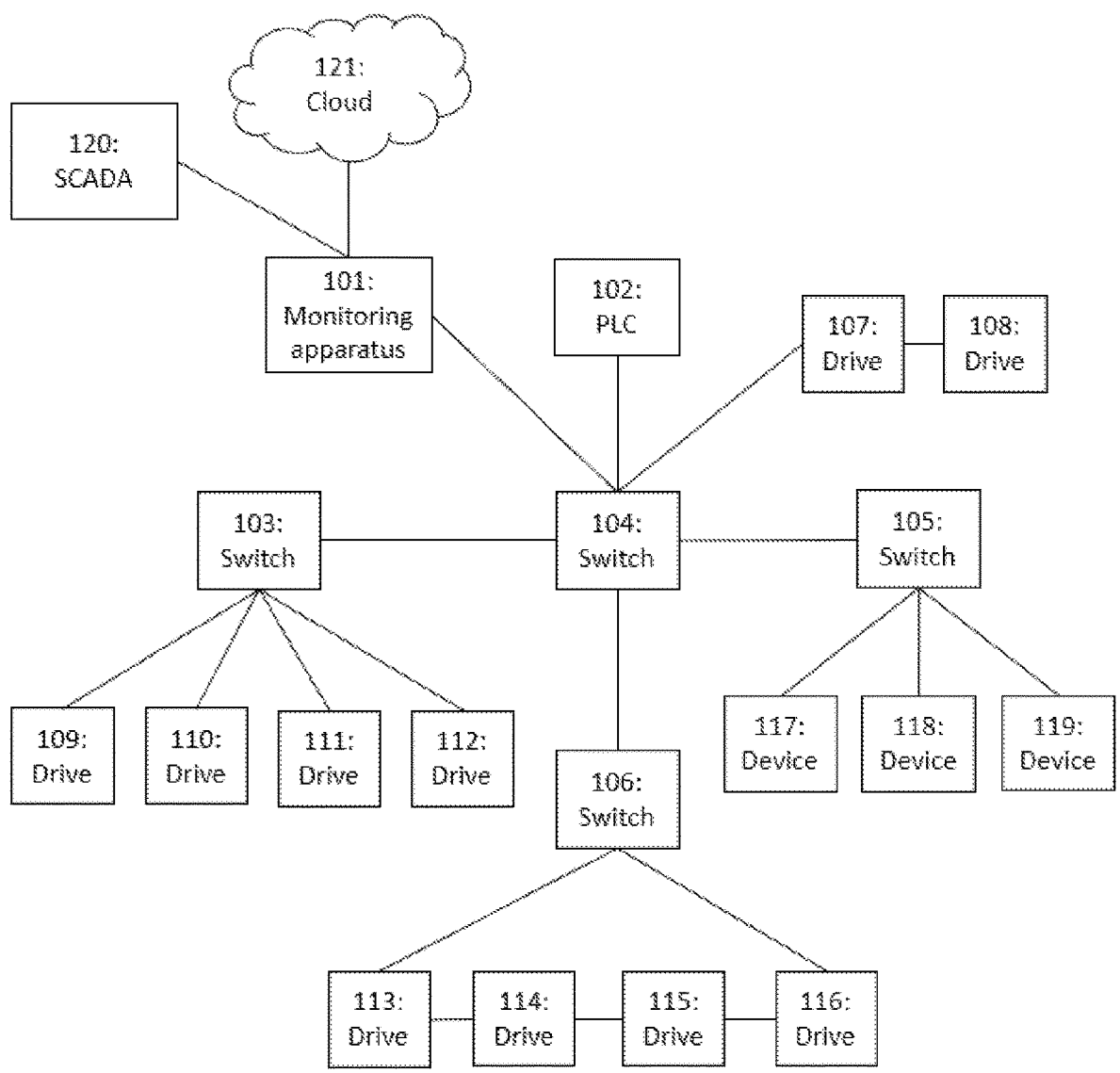
FIG. 1 illustrates a system according to an exemplary embodiment.

The following embodiments are exemplary. Although the specification may refer to "an", "one", or "some" embodiment(s) in several locations of the text, this does not necessarily mean that each such reference is made to the same embodiment(s), or that a particular feature only applies to a single embodiment. Single features of different embodiments may also be combined to provide other embodiments.

Different embodiments and examples are described below using single units, models, equipment and memory, without restricting the embodiments/examples to such a solution. Concepts called cloud computing and/or virtualization may be used. Virtualization may allow a single physical computing device to host one or more instances of virtual machines that appear and operate as independent computing devices, so that a single physical computing device can create, maintain, delete, or otherwise manage virtual machines in a dynamic manner. It is also possible that device operations will be distributed among a plurality of servers, nodes, devices or hosts. In cloud computing network devices, computing devices and/or storage devices provide shared resources. Some other technology advancements, such as Software-Defined Networking (SDN) may cause one or more of the functionalities described below to be migrated to any corresponding abstraction or apparatus or device. Therefore, all words and expressions should be interpreted broadly, and they are intended to illustrate, not to restrict, the exemplary embodiments.

An industrial automation system may be structured in hierarchical levels as a distributed control system (DCS). In this hierarchy, the upper levels for production management are linked to the direct control level of programmable logic controllers (PLC) via a non-time-critical communication system, such as Ethernet. Fieldbus is an industrial network system for real-time distributed control. The fieldbus links the PLCs of the direct control level to the devices in the field level, such as sensors, actuators, variable frequency drives, electric motors, console lights, switches, valves and contactors.

Industrial Ethernet refers to the use of Ethernet in an industrial environment with protocols that provide determinism and real-time control. Industrial Ethernet provides improved bandwidth and speed compared to traditional fieldbuses. Protocols for industrial Ethernet comprise, for example, PROFINET (process field network), Modbus TCP (TCP=transmission control protocol), and EtherNet/IP (IP=industrial protocol).

PROFINET is a standard for data communication over industrial Ethernet. PROFINET networks connect controllers and devices in an automation network. PROFINET can be used for collecting data and controlling devices in industrial control systems with low latency. PROFINET enables monitoring the devices and network without interfering with the industrial control system by means of parallel control and monitoring channels for example with a single PROFINET interface module, such as a FENA/FPNO/FSPS interface module. PROFINET also enables monitoring of devices from different manufacturers.

Some exemplary embodiments enable automatic real-time, or near real-time, monitoring and diagnostics of variable frequency drives and any other industrial devices without requiring any changes or additions to the existing control system, network equipment, configurations, or applications. The monitored devices may be from different manufacturers, for example. Some exemplary embodiments also enable monitoring a PROFINET network, including network load information, electromagnetic compatibility (EMC) indications, network switch overload, device overload, device configuration errors, etc. Some exemplary embodiments may be used on any computing device, such as an industrial computer.

FIG. 1 illustrates a system according to an exemplary embodiment. It should be noted that FIG. 1 illustrates a simplified system architecture only showing some elements and functional entities, all being logical units whose implementation may differ from what is shown. The connections shown in FIG. 1 are logical connections; the actual physical connections may be different. It is apparent to a person skilled in the art that the systems also comprise other functions and structures.

Referring to FIG. 1, a monitoring apparatus 101, for example an industrial computer, is connected to a PROFINET network via a network switch 104, which may also be referred to as an Ethernet switch. The monitoring apparatus may be connected to the PROFINET network via any free switch port or connection point anywhere in the network, and it may access all the devices in the network from one point. It should be noted that the monitoring apparatus may also be routed to the PROFINET network via another network.

The PROFINET network may use any topology. For example, the PROFINET network may comprise a plurality of network switches 103, 104, 105, 106, a plurality of variable frequency drives 107-116, and a plurality of other devices 117, 118, 119. The other devices 117, 118, 119 may be industrial devices that interact with a physical process. The other devices 117, 118, 119 may be third-party devices, for example. The connections in the network may be wired or wireless connections.

The variable frequency drives 107-116 may store, for example in an internal memory of the variable frequency drives, information on control parameter settings, for example present values of parameters such as controller gains, ramp times, output frequency, output voltage, output power, motor speed, motor torque, motor current, motor shaft power (i.e. the estimated mechanical power at the motor shaft), motor data, limits, magnetization settings, and/or signal filtering settings. The variable frequency drives may also store internal technical information recorded during the operation of the variable frequency drive, for example information on key performance indicators, such as load current histogram, torque ripple, torque vs. speed curves, and/or power vs. speed curves, temperature, voltage, and/or other information such as resonance frequencies and/or load inertias.

The PROFINET network further comprises a PLC 102 comprising a PROFINET controller. The PROFINET controller is an aggregator for real-time (cyclic) data sent by the devices in the network. For example, the PROFINET controller may comprise a PROFINET application relation for controlling the variable frequency drives and the other devices in the network. An application relation is a PROFINET structure that contains communication relationships. The types of application relations comprise supervisor, controller, device, and implicit relationship. The PROFINET controller may also collect information about each device's maintenance status, collect alarm messages, and provide all of this information to an end-user.

The monitoring apparatus 101 is configured to monitor and diagnose the variable frequency drives and the other devices in the network. It should be noted that the monitoring apparatus may be used to monitor and diagnose any number and type of devices in the PROFINET network. For example, the monitoring apparatus may run a PROFINET supervisor software component to access non-real-time data on the variable frequency drives and/or the other devices in the network, but the PROFINET supervisor has no access to cyclic or acyclic real-time data. The PROFINET supervisor may be configured for read-only access of the non-real-time data, i.e. only parallel record data access may be allowed. The PROFINET supervisor may use implicit application relation for accessing the device data. In other words, the PROFINET supervisor is not allowed to take over the control application relation. It should be noted that the PROFINET supervisor can be used as a plug-and-play solution to read data from the devices without requiring any configuration changes to the controller or to the devices in the network. The PROFINET supervisor may also access third-party device parameters via the record data according to the device manufacturer addresses. The PROFINET supervisor may further comprise a user interface for entering device internet protocol addresses, data addresses (for example slot/subslot/index), communication cycles, etc. The data addresses may be translated to parameters for at least some devices. The monitoring device may also run additional software for accessing more detailed diagnostics information and/or parameter changes on the variable frequency drives and/or the other devices. For example, the additional software may access TCP data on the devices. The monitoring apparatus 101 further comprises a diagnostics application for determining diagnostics information for the PROFINET network and/or the devices in the PROFINET network based at least partly on the obtained non-real-time data.

The monitoring apparatus 101 may be further configured to transmit the obtained data and/or the diagnostics information to upper level systems, such as a supervisory control and data acquisition (SCADA) system 120 and/or a cloud server 121. The cloud server 121 may comprise a cloud database and/or one or more cloud services, such as a remote monitoring service and/or a data analytics service for the devices in the PROFINET network. Thus, the monitoring apparatus may enable cloud services also for legacy devices, which may have no other means of cloud connectivity. For example, the open platform communications unified architecture (OPC UA) communication protocol may be used for transferring data to the SCADA system. Furthermore, for example OPC UA, or representational state transfer (REST), or the message queuing telemetry transport (MQTT) communication protocol may be used for transferring data to the cloud. The monitoring apparatus may further comprise a user interface for configuring parameters for the OPC UA/REST/MQTT protocols in order to communicate with the upper level systems. The monitoring apparatus may apply for example transport layer security (TLS) for the protocols for communicating with the upper level systems.

In another exemplary embodiment, the diagnostics application may be comprised in the PLC 102, for example.

It should be noted that some exemplary embodiments are not limited to PROFINET networks and devices, and they may also be applied to other fieldbus protocols.

In another exemplary embodiment, the simple network management protocol (SNMP) may be used to collect data from the devices in the network.

Figure 2:
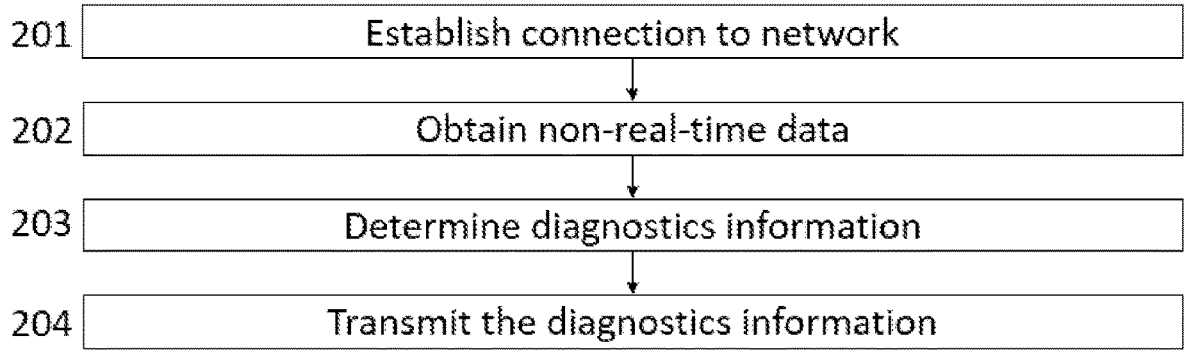
FIGS. 2-4 illustrate flow charts according to some exemplary embodiments.

FIG. 2 illustrates a flow chart according to an exemplary embodiment. Referring to FIG. 2, a connection is established 201 to a PROFINET network via a free switch port or other single connection point in the PROFINET network. The connection may be a plug-and-play connection, meaning that no configuration changes are needed to the PROFINET network or to the plurality of devices comprised therein. The plurality of devices in the PROFINET network may comprise, for example, one or more variable frequency drives and/or one or more other industrial devices.

Non-real-time data is obtained 202 from the plurality of devices comprised in the PROFINET network via the switch port or connection point by using a PROFINET non-real-time channel. For example, a PROFINET supervisor may be used to obtain, or read, the non-real-time data. The obtained non-real-time data may comprise PROFINET data records, such as PDRealData, LogBookData, RealIdentificationData, ModuleDiffBlock, etc. PDRealData returns port-specific information of a device, such as port information and peer information, i.e. connected neighbour devices and port status. LogBookData comprises log data. RealIdentificationData indicates the actual device modules. ModuleDiffBlock indicates if device modules are different between real and expected.

Further examples of PROFINET data records, or record data objects, that may be comprised in the obtained non-real-time data are presented in the following: DiagnosisData, ExpectedIdentificationData, SubstituteValue, RecordInputDataObjectElement, RecordOutputDataObjectElement, ARData, IMData, APIData, PDPortDataAdjust, PDPortDataCheck, PDPortDataReal, PDPortDataRealExtended, PDIRData, PDSyncData, PDTimeData, PdevData, IsochronousModeData, PDInterfaceAdjust, PDInterfaceMrpDataAdjust, PDInterfaceMrpDataCheck, PDInterfaceMrpDataReal, PDPortMrpDataAdjust, PDPortMrpDataReal, PDPortFODataReal, PDPortFODataAdjust, PDPortFODataCheck, PDExpectedData, PDNCDataCheck, PDPortStatistic, I&M0FilterData, ARFSUDataAdjust, PDInterfaceFSUDataAdjust, PDInterfaceDataReal, AutoConfiguration, PDIRSubframeData, UploadBLOB, PE_EntityFilterData, PE_EntityStatusData, AssetManagementData, RS_AdjustObserver, RS_GetEvent, PDPortMrpIcDataAdjust, PDPortMrpIcDataCheck, PDPortMrpIcDataReal, PDPortSFPDataCheck, ApplicationReadyBlock, TSNNetworkControlDataReal, TSNNetworkControlDataAdjust, TSNStreamPathData, TSNSyncTreeData, TSNUploadNetworkAttributes, TSNExpectedNetworkAttributes, TSNAddStreamRsp, TSNRemoveStreamRsp, TSNRenewStreamRsp, PDRsilnstances, PDInterfaceSecurityAdjust, manufacturer-specific data, and/or NULL. NULL may be used, if a requested data record is empty.

A diagnostics application is used to determine 203 diagnostics information for at least a part of the PROFINET network based at least partly on the obtained non-real-time data. The diagnostics application may perform for example raw data scaling on the obtained non-real-time data. Alternatively, the diagnostics application may use fuzzy logic for example to perform predictive analytics based on the received data, for example to predict faults and/or estimate the condition of the PROFINET network or the devices in the network.

As a first example, the diagnostics information may comprise at least an estimated network load associated with at least a part of the PROFINET network, or the complete PROFINET network. The diagnostics application may estimate the PROFINET network load in various locations in the network, and generate a warning or alarm, if the PROFINET network is determined to be overloaded. The network load may depend on the amount of obtained non-real-time data, for example the number of parameters, and the time interval used for obtaining the non-real-time data. For example, PROFINET supervisor may be used to read record data index 0xf841, for example specific elements from the PDPortStatistic data record header, from one or more devices of the plurality of devices within the defined time interval. For example, error statistics may be read from PDPortStatistic. The record data index 0xf841 comprises port-related configuration data, port-related status data, and/or port-related statistical data for the one or more devices of the plurality of devices in the PROFINET network. Herein a port may refer to a software communication port or to a physical hardware port. The record data index 0xf841 may comprise PROFINET data records such as PDRealData, PDExpectedData, PDPortDataReal, PDPortDataRealExtended, OwnPort, Neighbors (comprising for example a media access control address and/or port name for one or more neighboring devices, as well as the number of neighboring devices), PDInterfaceDataReal (comprising for example the media access control address for the device from which the data is obtained), TxPortGroup, and/or SubstituteValue. The diagnostics application may then use fuzzy logic to determine the data flow per time unit in real-time by taking into account the change of network conditions. For example, the network load may be approximately 20 kbps for 15 parameters with a 200 ms interval. The diagnostics application may then compare the data throughput against PROFINET recommendations and/or general network load recommendations, and the diagnostics application may generate a warning to a user for example if an overload is detected. After seeing the warning, the user may then fine-tune the PROFINET parameterization via a user interface in order to decrease the network load or find a possible source for broadcast storm, for example.

As a second example, the diagnostics information may comprise at least an estimated load, or switch load, for one or more devices of the plurality of devices comprised in the PROFINET network. The diagnostics application may estimate a load for the one or more devices, and generate a warning or alarm, if the one or more devices are determined to be overloaded. For example, PROFINET supervisor may be used to read record data index 0xf841, for example specific elements from the PDPortStatistic data record header, from one or more devices of the plurality of devices within the defined time interval. The diagnostics application may then use fuzzy logic to determine discarded frames per time unit in real-time by taking into account the change of network conditions. The diagnostics application may generate a warning to a user for switch overload of the one or more devices, which may lead to a loss of frames/data. After seeing the warning, the user may fine-tune the PROFINET parameterization and avoid PROFINET watchdog tripping, thus avoiding an uninvited stop of the device, such as a variable frequency drive controller motor stop.

As a third example, the diagnostics information may comprise at least one detected electromagnetic interference issue associated with at least one device of the plurality of devices. The diagnostics application may detect loose cable connections, electromagnetic compatibility (EMC) issues and/or electromagnetic interference (EMI) issues in various locations in the network, and generate a warning or alarm, if an EMC/EMI issue is detected or data is corrupted. For example, PROFINET supervisor may be used to read record data index 0xf841, for example specific elements from the PDPortStatistic data record header, from one or more devices of the plurality of devices within the defined time interval. The diagnostics application may then use fuzzy logic to determine error frames per time unit in real-time by taking into account the change of network conditions and total data throughput from the first example. The diagnostics application may compare the error frame frequency to the total data throughput and generate a warning to a user for EMI, loose cable connectors, etc. After seeing the warning, the user may then locate possible sources of EMI and/or check the cable connectors.

As a fourth example, the diagnostics information may comprise at least one detected configuration error associated with at least one device of the plurality of devices. The diagnostics application may detect configuration errors associated with the devices, as well as instruct a user on how to correct or optimize the configuration. For example, if the user configured the wrong device, such as a variable frequency drive instead of a valve, and attempted to start it with the controller, the device would detect that the startup data does not match its real identity, and the device would signal a configuration error to the controller at startup. The PROFINET supervisor can read the configuration error from the device by using the data record "Application Log Data". As another example, if the user configured the correct device, but did not configure all of the modules properly, then ModuleDiffBlock would indicate a difference.

The diagnostics information may be transmitted 204 to a cloud server and/or to a SCADA system.

Figure 3:
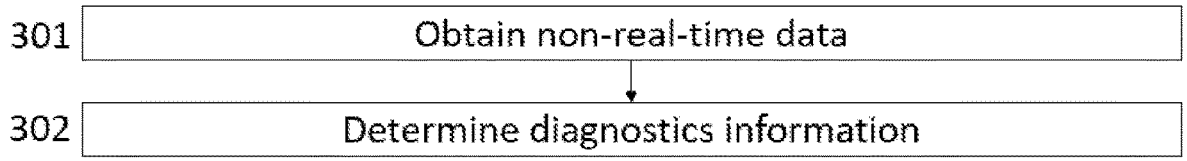

FIG. 3 illustrates a flow chart according to an exemplary embodiment. Referring to FIG. 3, non-real-time data is obtained 301 from a plurality of devices comprised in a process field network, wherein the non-real-time data comprises at least one of: port-related configuration data, port-related status data, and/or port-related statistics data for the plurality of devices. Diagnostics information is determined 302 for at least a part of the process field network based at least partly on the obtained non-real-time data.

Figure 4:
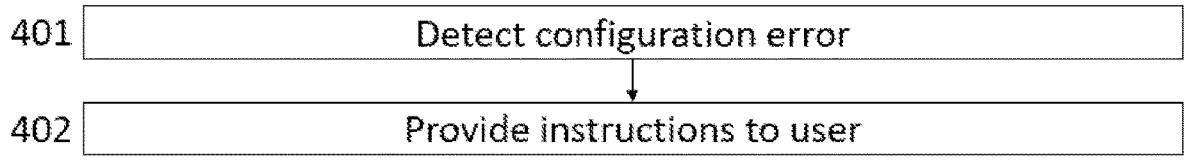

FIG. 4 illustrates a flow chart according to an exemplary embodiment. Referring to FIG. 4, a configuration error associated with at least one device of the plurality of devices is detected 401, while determining the diagnostics information. Instructions on how to correct the configuration error are provided 402 to a user for example via a graphical user interface. For example, if the detected configuration error indicates that the user configured a wrong device, then the instructions may indicate the correct device that the user should configure instead of the wrong device in order to correct the configuration error.

The functions and/or blocks described above by means of FIGS. 2-4 are in no absolute chronological order, and some of them may be performed simultaneously or in an order differing from the described one. Other functions and/or blocks may also be executed between them or within them.

A technical advantage provided by some exemplary embodiments is that they may enable monitoring the condition of a large number of devices, for example more than 1000 devices, wherein some of the devices may be from different manufacturers. Some exemplary embodiments may provide a plug-and-play solution that may be integrated to a pre-existing network on the fly by using any free port in the network without requiring any changes to the existing control system, network equipment, configurations, or applications. Some exemplary embodiments may also enable scalable diagnostics and data collection for the network and/or devices. Some exemplary embodiments may be used for small devices as well as factory-wide systems.

Figure 5:
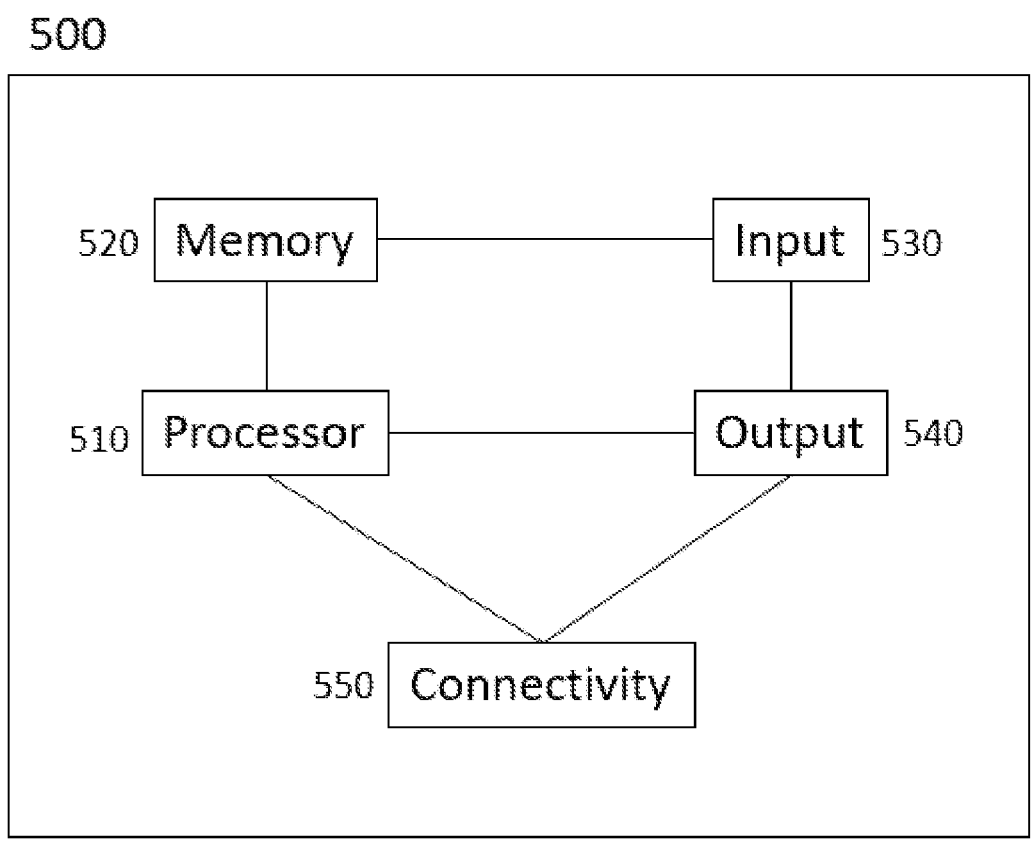
FIG. 5 illustrates an apparatus according to an exemplary embodiment.

FIG. 5 illustrates an apparatus 500, which may be an apparatus such as an industrial computer according to an exemplary embodiment. The apparatus 500 comprises a processor 510. The processor 510 interprets computer program instructions and processes data. The processor 510 may comprise one or more programmable processors. The processor 510 may comprise programmable hardware with embedded firmware and may, alternatively or additionally, comprise one or more application specific integrated circuits (ASICs).

The processor 510 is coupled to a memory 520. The processor is configured to read and write data to and from the memory 520. The memory 520 may comprise one or more memory units. The memory units may be volatile or non-volatile. It is to be noted that in some exemplary embodiments there may be one or more units of non-volatile memory and one or more units of volatile memory or, alternatively, one or more units of non-volatile memory, or, alternatively, one or more units of volatile memory. Volatile memory may be for example RAM, DRAM or SDRAM. Non-volatile memory may be for example ROM, PROM, EEPROM, flash memory, optical storage or magnetic storage. In general, memories may be referred to as non-transitory computer readable media. The memory 520 stores computer readable instructions that are executed by the processor 510. For example, non-volatile memory stores the computer readable instructions and the processor 510 executes the instructions using volatile memory for temporary storage of data and/or instructions.

The computer readable instructions may have been pre-stored to the memory 520 or, alternatively or additionally, they may be received, by the apparatus, via electromagnetic carrier signal and/or may be copied from a physical entity such as computer program product. Execution of the computer readable instructions causes the apparatus 500 to perform the functionality described above.

In the context of this document, a "memory" or "computer-readable media" may be any non-transitory media or means that can contain, store, communicate, propagate or transport the instructions for use by or in connection with an instruction execution system, apparatus, or device, such as a computer.

The apparatus 500 further comprises, or is connected to, an input unit 530. The input unit 530 comprises one or more interfaces for receiving input. The one or more interfaces may comprise for example one or more buttons and/or one or more touch detection units. Further, the input unit 530 may comprise an interface to which external devices may connect to, and/or a user interface that a user may use to enter one or more inputs to the apparatus 500.

The apparatus 500 may also comprise an output unit 540. The output unit may comprise or be connected to one or more displays capable of rendering visual content such as a light emitting diode (LED) display, a liquid crystal display (LCD) or a liquid crystal on silicon (LCoS) display.

The apparatus 500 may further comprise a connectivity unit 550. The connectivity unit 550 enables wired and/or wireless connectivity to external networks and/or devices. The connectivity unit 550 may comprise one or more antennas and one or more receivers that may be integrated to the apparatus 500 or that the apparatus 500 may be connected to. The connectivity unit 550 may comprise an integrated circuit or a set of integrated circuits that provide the wireless communication capability for the apparatus 500. Alternatively, the wireless connectivity may be a hard-wired ASIC.

It is to be noted that the apparatus 500 may further comprise various components not illustrated in FIG. 5. The various components may be hardware components and/or software components.

As used in this application, the term "circuitry" may refer to one or more or all of the following: a) hardware-only circuit implementations (such as implementations in only analog and/or digital circuitry); and b) combinations of hardware circuits and software, such as (as applicable): i) a combination of analog and/or digital hardware circuit(s) with software/firmware and ii) any portions of hardware processor(s) with software (including digital signal processor(s)), software, and memory(ies) that work together to cause an apparatus, such as a mobile phone, to perform various functions); and c) hardware circuit(s) and/or processor(s), such as a microprocessor(s) or a portion of a microprocessor(s), that requires software (for example firmware) for operation, but the software may not be present when it is not needed for operation.

This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device, a cellular network device, or other computing or network device.

The techniques and methods described herein may be implemented by various means. For example, these techniques may be implemented in hardware (one or more devices), firmware (one or more devices), software (one or more modules), or combinations thereof. For a hardware implementation, the apparatus(es) of exemplary embodiments may be implemented within one or more application-specific integrated circuits (ASICs), digital signal processors (DSPs), digital signal processing devices (DSPDs), programmable logic devices (PLDs), field programmable gate arrays (FPGAs), graphics processing units (GPUs), processors, controllers, micro-controllers, microprocessors, other electronic units designed to perform the functions described herein, or a combination thereof. For firmware or software, the implementation can be carried out through modules of at least one chipset (for example procedures, functions, and so on) that perform the functions described herein. The software codes may be stored in a memory unit and executed by processors. The memory unit may be implemented within the processor or externally to the processor. In the latter case, it can be communicatively coupled to the processor via various means, as is known in the art. Additionally, the components of the systems described herein may be rearranged and/or complemented by additional components in order to facilitate the achievements of the various aspects, etc., described with regard thereto, and they are not limited to the precise configurations set forth in the given drawings, as will be appreciated by one skilled in the art.

It will be obvious to a person skilled in the art that, as technology advances, the inventive concept may be implemented in various ways. The embodiments are not limited to the exemplary embodiments described above, but may vary within the scope of the claims. Therefore, all words and expressions should be interpreted broadly, and they are intended to illustrate, not to restrict, the exemplary embodiments.

The invention claimed is:

1. An apparatus comprising at least one processor, and at least one memory including computer program code, wherein the at least one memory and the computer program code are configured, with the at least one processor, to cause the apparatus to:
   establish a plug-and-play connection between the apparatus and a process field network via a free switch port or a single connection point in the process field network;
   obtain, via the free switch port or the single connection point, non-real-time data from a port data record header for a plurality of devices comprised in the process field network, wherein the non-real-time data comprises at least one of: port-related configuration data, port-related status data, and/or port-related statistics data for the plurality of devices; and
   determine diagnostics information for at least a part of the process field network based at least partly on the non-real-time data, wherein the port data record header comprises a Profinet data record PDPortStatistic.

2. The apparatus of claim 1, wherein the apparatus is further caused to:
   transmit the diagnostics information to a cloud server and/or to a supervisory control and data acquisition system.

3. The apparatus of claim 1, wherein the diagnostics information is determined by using fuzzy logic.

4. The apparatus of claim 1, wherein the diagnostics information comprises at least an estimated network load associated with the at least part of the process field network, wherein the estimated network load is based on an amount of the non-real-time data and a time interval used for obtaining the non-real-time data.

5. The apparatus of claim 1, wherein the diagnostics information comprises at least an estimated load for one or more devices of the plurality of devices.

6. The apparatus of claim 1, wherein the apparatus is further caused to:
   provide instructions to a user for correcting the detected configuration error, wherein the detected configuration error indicates that the user configured a wrong device.

7. The apparatus of claim 1, wherein the apparatus is further caused to:
   establish a plug-and-play connection between the apparatus and the process field network via a free switch port or a single connection point in the process field network,
   wherein the non-real-time data is obtained via the switch port or the connection point.

8. A method comprising:
   establishing a plug-and-play connection to a process field network via a free switch port or a single connection point in the process field network;
   obtaining, via the free switch port or the single connection point, non-real-time data from a port data record header for a plurality of devices comprised in the process field network, wherein the non-real-time data comprises at least one of: port-related configuration data, port-related status data, and/or port-related statistics data for the plurality of devices; and
   determining diagnostics information for at least a part of the process field network based at least partly on the non-real-time data, wherein the port data record header comprises a Profinet data record PDPortStatistic.

9. A non-transitory computer readable medium comprising program instructions for causing an apparatus to perform at least the following:
   establish a plug-and-play connection between the apparatus and a process field network via a free switch port or a single connection point in the process field network;
   obtain, via the switch port or the single connection point, non-real-time data from a port data record header for a plurality of devices comprised in the process field network, wherein the non-real-time data comprises at least one of: port-related configuration data, port-related status data, and/or port-related statistics data for the plurality of devices; and
   determine diagnostics information for at least a part of the process field network based at least partly on the non-real-time data, wherein the port data record header comprises a Profinet data record PDPortStatistic.

10. A system comprising at least an apparatus and a process field network comprising a plurality of devices;
    wherein the apparatus is configured to:
    establish a plug-and-play connection between the apparatus and the process field network via a free switch port or a single connection point in the process field network;
    obtain, via the switch port or the single connection point, non-real-time data from a port data record header for a plurality of devices comprised in the process field network, wherein the non-real-time data comprises at least one of: port-related configuration data, port-related status data, and/or port-related statistics data for the plurality of devices; and
    determine diagnostics information for at least a part of the process field network based at least partly on the non-real-time data, wherein the port data record header comprises a Profinet data record PDPortStatistic.

11. The system of claim 10, wherein the plurality of devices comprises devices from different manufacturers.

12. The apparatus of claim 1, wherein the diagnostics information includes at least one of a detected electromagnetic interference issue associated with at least one device of the plurality of devices, a detected loose cable connection associated with at least one device of the plurality of devices, or a detected configuration error associated with at least one device of the plurality of devices.

13. The method of claim 8, wherein the diagnostics information includes at least one of a detected electromagnetic interference issue associated with at least one device of the plurality of devices, a detected loose cable connection associated with at least one device of the plurality of devices, or a detected configuration error associated with at least one device of the plurality of devices.

14. The non-transitory computer readable medium of claim 9, wherein the diagnostics information includes at least one of a detected electromagnetic interference issue associated with at least one device of the plurality of devices, a detected loose cable connection associated with at least one device of the plurality of devices, or a detected configuration error associated with at least one device of the plurality of devices.

15. The system of claim 10, wherein the diagnostics information includes at least one of a detected electromagnetic interference issue associated with at least one device of the plurality of devices, a detected loose cable connection associated with at least one device of the plurality of devices, or a detected configuration error associated with at least one device of the plurality of devices.

\* \* \* \* \*